Figure 1:
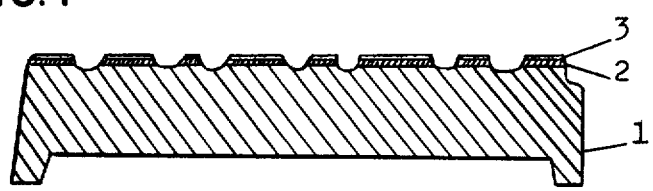

United States Patent [19]

Imanaka et al.

[11] 4,268,570
[45] May 19, 1981

[54] METAL-COATED PLASTIC PRODUCT

[75] Inventors: Hiroshi Imanaka; Yoshihiko Kijima, both of Otsu, Japan

[73] Assignee: Toyo Boseki Kabushiki Kaisha, Japan

[21] Appl. No.: 55,434

[22] Filed: Jul. 6, 1979

[30] Foreign Application Priority Data

Jul. 7, 1978 [JP] Japan ................. 53-83194

[51] Int. Cl.³ .............. B32B 15/08; C08L 67/06
[52] U.S. Cl. ................. 428/216; 428/458; 428/463; 428/424.4; 428/424.8; 428/425.8; 428/520; 428/522; 428/480; 525/92; 525/173; 525/174
[58] Field of Search ........... 428/458, 216, 463, 520, 428/522, 480, 424.4, 424.8, 425.8; 525/64, 92, 173, 174

[56] References Cited

U.S. PATENT DOCUMENTS

| | | | |
|---|---|---|---|
| 3,538,055 | 11/1970 | Camilleri | 428/458 |
| 3,700,481 | 10/1972 | Chin | 428/458 |
| 3,795,644 | 3/1974 | Jackson | 428/458 |
| 3,931,073 | 1/1976 | Jackson | 428/458 |
| 4,009,312 | 2/1977 | Hayashi | 428/458 |
| 4,052,522 | 10/1977 | Narita | 428/463 |
| 4,110,411 | 8/1978 | Imanaka | 525/92 |
| 4,143,790 | 3/1979 | Meno | 428/458 |

*Primary Examiner*—Ellis P. Robinson
*Attorney, Agent, or Firm*—Jones, Tullar & Cooper

[57] ABSTRACT

Metal-coated plastic product which comprises a molded product of a mixture of 95 to 20% by weight of a polyester block copolymer and 5 to 80% by weight of a copolymer comprising an acrylic monomer, butadiene and styrene and a layer of a metallic coating which is provided optionally via a layer of an adhesive, and optionally a layer of a top coating. Said metal-coated plastic product has excellent properties such as excellent stiffness, plasticity, processability, and further beautiful and gloss appearance and is useful as a substitute of metallic products.

13 Claims, 3 Drawing Figures

METAL-COATED PLASTIC PRODUCT

The present invention relates to plastic molded products, such as resin plates, tubes, long articles having miscellaneous shapes, gasket, pipes, or the like, which are coated with a metal. More particularly, it relates to molded products made of a mixture of a polyester block copolymer and a copolymer of an acrylic monomer, butadiene and styrene, the surface of which product is coated with a metal.

Metallic products having various shapes such as plate, bar, tube, or the like have widely been used because of their excellent properties such as excellent stiffness, processability, and gloss and beautiful surface. However, these metallic products have also various drawbacks. For instance, metallic decorative articles or emblem for automobile are readily deformed (e.g. dented or bent) when impacted by accident and the original shapes are hardly recovered. Moreover, it is very difficult to produce emblems having complicated shapes. Besides, metallic products easily rust.

As a substitute of the metallic products, there have, hitherto, been used various resin plates such as ABS resin plates which are coated with a metal by plating or hot-stamping. However, these resin plates are hardly bent, and hence it is very difficult to mold to the desired emblems having complicated shapes, which requires a precise mold.

It has also been tried to use an elastomer of polyester block copolymer for the preparation of emblems (cf. Japanese Patent Publication (unexamined) No. 77173/1975). The elastomer can easily be formed in various shapes and its original shape is also advantageously recovered even when it is deformed, but on the other, this elastomer has also drawbacks, such as inferior adhesion with metals and conventional adhesives, and further, when it is coated with a metal, the coating is easily peeled off by impact or the like.

The above drawbacks are also observed in other shaped products such as bars, pipes, tubes, or the like.

As a result of the present inventors' intensive study, it has been found that a molded product of a mixture of a polyester block copolymer and a copolymer of an acrylic monomer, butadiene and styrene has excellent properties such as stiffness, processability and when it is coated with a metal, the coated product can keep its beautiful appearance for a long period of time without peeling off of the metallic coating layer and hence is excellent as a substitute of a metallic product.

An object of the present invention is to provide an improved substitute of a metallic product. Another object of the invention is to provide a plastic molded product coated with a metal which has an appearance like metallic products and has excellent properties similar to or greater than the conventional metallic products. These and other objects of the invention are apparent from the following description.

The product of the present invention comprises a molded product of a mixture of a polyester block copolymer and a copolymer comprising predominantly an acrylic monomer, butadiene and styrene, and a layer of metallic coating and optionally a top coating layer.

The molded product of the present invention is illustrated with reference to the accompanying drawings.

Figure 2:
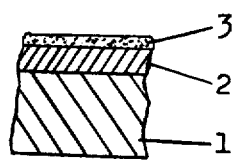
Figure 3:
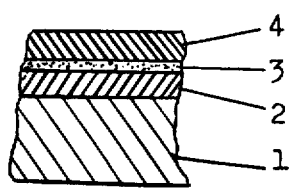

FIG. 1 shows a schematic sectional view of an embodiment of the molded product of the present invention, i.e. an emblem made of the molded product of plastic coated with a metal. FIG. 2 is a magnified sectional view of a part of the emblem shown in FIG. 1. FIG. 3 shows a schematic sectional view of a part of another embodiment of the molded product of the present invention.

As is shown in FIGS. 1 and 2, the molded product of the present invention comprises a base plate 1 made of a molded product of a mixture a polyester block copolymer and a copolymer comprising predominantly an acrylic monomer, butadiene and styrene, and a layer of metallic coating 3 optionally via a layer of an adhesive 2. The adhesive is not necessarily required, but it is preferable to enhance the adhesion between the base plate 1 and the metallic coating layer 3. The molded product of the present invention may also have a layer of top coating 4 as is shown in FIG. 3. The top coating is not necessarily essential, but is preferably given in order to increase the resistance against peeling off and abrasion of the metallic coating layer 3.

The polyester block copolymer used in the present invention is a block copolymer elastomer consisting of a hard polyester segment having a high melting point and a soft polymer segment having a low melting point (cf. U.S. Pat. No. 4,110,411). The polyester segment having a high melting point should be composed of a component that can singly form a high polymer having a melting point of 150° C. or higher, and the polymer segment having a low melting point should have a molecular weight of 400 to 6,000 and should be composed of a component that has a melting or softening point of 80° C. or lower.

The polyester segment having a high melting point is constituted by a polyester produced from an aromatic dicarboxylic acid or an ester thereof (e.g. terephthalic acid, isophthalic acid, 1,5-naphthalenedicarboxylic acid, 2,6-naphthalenedicarboxylic acid, 4,4'-diphenyldicarboxylic acid, bis(4-carboxyphenyl)methane, bis(4-carboxyphenyl)sulfonic acid, or the like) and an aliphatic, aromatic or alicyclic diol having 2 to 10 carbon atoms (e.g. ethylene glycol, propylene glycol, tetramethylene glycol, pentamethylene glycol, 2,2-dimethyltrimethylene glycol, hexamethylene glycol, decamethylene glycol, p-xylylene glycol, 1,4-cyclohexanedimethanol, or the like); a copolyester produced from two or more of the above aromatic dicarboxylic acids and two or more of the above diols; a polyester produced from a hydroxy acid or an ester thereof (e.g. p-($\beta$-hydroxyethoxy)benzoic acid, p-hydroxybenzoic acid, or the like); a polylactone (e.g. polypivarolactone); a polyether ester produced from an aromatic ether dicarboxylic acid (e.g. 1,2-bis(4,4'-dicarboxyphenoxy)ethane) and the diol mentioned above; or a copolyester produced from a combination of the above-mentioned dicarboxylic acid, hydroxy acid and diol.

Preferred example of the polyester which constitutes the polyester segment having a high melting point is the one produced from a dicarboxylic acid containing 70% by mol or more of terephthalic acid or its ester-forming derivative and an aliphatic, aromatic or alicyclic diol, preferably an aliphatic diol, particularly an aliphatic diol containing 70% by mol or more of ethylene glycol or tetramethylene glycol. The most practically useful polyester is the one produced from terephthalic acid and ethylene glycol or tetramethylene glycol.

The polymer segment having a low melting point and a molecular weight of 400 to 6,000 is constituted by a polyalkylene ether glycol (e.g. poly(ethylene oxide) glycol, poly(propylene oxide) glycol, poly(tetramethylene oxide) glycol, etc.); or a mixture of these polyalkylene ether glycols; or a copolyether glycol which is produced by copolymerizing the polyether components of the above polyalkylene ether glycols. The polymer segment having a low melting point includes also a polyester obtained from an aliphatic dicarboxylic acid having 2 to 12 carbon atoms and an aliphatic glycol having 2 to 10 carbon atoms, such as polyethylene adipate, polytetramethylene adipate, polyethylene sebacate, polytetramethylene dodecanoate, polytetramethylene azelate, polyneopentyl azelate, polyneopentyl adipate, polyneopentyl sebacate; a polylactone such as poly($\epsilon$-caprolactone), poly($\delta$-valerolactone) or the like, and also a polyester-polyether copolymer comprising a combination of the above polyester and the above polyether. Preferred polymer segment having a low melting point is the one produced from polyalkylene ether glycol, more preferably poly(tetramethylene oxide) glycol.

The polymer segment having a low melting point is preferably included in the polyester block copolymer in an amount of 5 to 80% by weight.

Preferred polyester block copolymer comprising a polyester segment having a high melting point and a polymer segment having a low melting point is the one comprising a polyester produced from a dicarboxylic acid containing 70% by mol or more of terephthalic acid or its ester-forming derivative and an aliphatic, aromatic or alicyclic diol (as the polyester segment having a high melting point) and a polyalkylene ether glycol or an aliphatic polyester (as the polymer segment having a low melting point). Particularly preferred polyester block copolymer comprises a dicarboxylic acid containing 70% by mol or more of terephthalic acid or its ester-forming derivative (as the polyester segment having a high melting point) and a polyalkylene ether glycol (as the polymer segment having a low melting point).

Suitable examples of the polyester block copolymer are polyethylene terephthalate/polyethylene oxide block copolymer, polyethylene terephthalate/polytetramethylene oxide block copolymer, polytetramethylene terephthalate/polyethylene oxide block copolymer, polytetramethylene terephthalate/polytetramethylene oxide block copolymer, polytetramethylene terephthalate isophthalate/polytetramethylene oxide block copolymer, polyethylene terephthalate/poly-$\epsilon$-caprolactone block copolymer, polytetramethylene terephthalate/poly-$\epsilon$-caprolactone block copolymer, poly-$\delta$-pivalolactone/poly-$\epsilon$-caprolactone block copolymer, polyethylene terephthalate/polyethylene adipate block copolymer, polyethylene terephthalate/polyneopentyl sebacate block copolymer, polyethylene terephthalate/polyneopentyl dodecanoate block copolymer, or the like. Among them, polytetramethylene terephthalate/polytetramethylene oxide block copolymer, polytetramethylene terephthalate isophthalate/polytetramethylene oxide block copolymer and polytetramethylene terephthalate/poly-$\epsilon$-caprolactone block copolymer are particularly preferred one.

The polyester block copolymer comprises 95 to 20% by weight, preferably 95 to 40% by weight, of the polyester segment having a high melting point and 5 to 80% by weight, preferably 5 to 60% by weight, of the polymer segment having a low melting point.

The polyester block copolymer can be produced by conventional polycondensation processes. For instance, an aromatic dicarboxylic acid or its ester, a diol which can form a polymer segment having a low melting point, and a diol having a low molecular weight are heated at a temperature of about 150° to 260° C. in the presence of a catalyst and further heated preferably under reduced pressure to subject them to a polycondensation reaction, by which there is obtained a polyester block copolymer having a high degree of polymerization. Alternatively, the polyester block copolymer may be produced by reacting a prepolymer which can form the polyester segment having a high melting point, a prepolymer which can form the polymer segment having a low molecular weight, and a bifunctional compound which is reactive with the terminal functional groups of the above prepolymers and further reacting under reduced pressure; or by mixing with heating a polyester having a high melting point and a high degree of polymerization and a lactone monomer, wherein a ring-opening polymerization and an ester-exchange reaction simultaneously proceed.

The copolymer to be admixed with the above polyester block copolymer comprises 10 to 80% by weight, preferably 20 to 80% by weight, of an acrylic monomer, 10 to 70% by weight, preferably 10 to 60% by weight, of butadiene, and 10 to 60% by weight, preferably 10 to 50% by weight, of styrene (total amount of these components is 100% by weight). Particularly preferred copolymer is a graft copolymer consisting of polybutadiene or a butadiene copolymer containing 95% by weight or less of an acrylic acid ester as the backbone and an acrylic monomer and/or styrene as the branch.

The acrylic monomer includes an alkyl ester of acrylic acid having 1 to 10 carbon atoms in the alkyl moiety (e.g. methyl acrylate, ethyl acrylate), an alkyl ester of methacrylic acid having 1 to 10 carbon atoms in the alkyl moiety (e.g. methyl methacrylate, ethyl methacrylate, acrylonitriles (e.g. acrylonitrile, methacrylonitrile), or the like, which may be used alone or a combination of two or more thereof. Among them, acrylonitrile and methyl methacrylate are particularly preferred.

The copolymers comprising predominantly an acrylic monomer, butadiene and styrene can be produced by graft-polymerizing a polybutadiene or a copolymer comprising predominantly butadiene and an acrylic monomer with a monomer comprising predominantly styrene and other acrylic monomer; or by mixing a copolymer comprising predominantly butadiene and an acrylic monomer and a copolymer comprising predominantly an acrylic monomer and styrene; or by emulsion-polymerizing an acrylic monomer, butadiene and styrene.

The polyester block copolymer and the copolymer of an acrylic monomer, butadiene and styrene are preferably mixed in the ratio of 95 to 20% by weight, more preferably 95 to 40% by weight, of the polyester block copolymer and 5 to 80% by weight, more preferably 5 to 60% by weight, of the copolymer of an acrylic monomer, butadiene and styrene. When the copolymer of an acrylic monomer, butadiene and styrene is contained in an amount of less than 5% by weight, the molded product obtained from the mixture has inferior adhesion with a metal, and on the other hand, when the amount is over 80% by weight, the molded product has inferior elasticity, heat resistance and aging resistance.

The copolymers can be mixed by conventional methods, for instance, by kneading in molten state with a single screw or multi screw kneader, a kneading roller, or Banbury mixer, or by mixing solutions of the copolymers in an appropriate solvent. Other additives, such as antioxidants, weathering agents, plasticizers, pigments, fillers, or the like may also be admixed during the mixing step. The fillers include fiber materials such as glass fiber, carbon fiber, or the like.

The mixture of the copolymers can be molded into molded products having various shapes by the conventional molding processes, such as injection molding, extrusion molding, transfer molding, blowing, rotational molding, or the like.

The molded product of the copolymers obtained above is coated with a metal. The metal includes aluminum, chromium, nickel, tin, silver, gold, or an alloy of these metals, which are hardly rusted. The coating with the metal can be carried out by the conventional methods, such as spattering, vacuum metallizing, hot-stamping, or a combination of a chemical or electical plating with the above spattering or vacuum metallizing. Moreover, it may be done by laminating a film coated previously with a metal. The layer of metallic coating may usually have a thickness of 0.01 to 5μ. However, when the layer of metallic coating is too thick, it shows inferior bending properties and tends to be broken, and hence, the layer of the metallic coating has preferably a thickness of 0.01 to 2μ. For this purpose, spattering and vacuum metallizing are preferable as the coating method. The metallic coating is not necessarily performed on the whole of the surface of the molded product, but may partially be performed in accordance with the desired design.

The molded product of the present invention has excellent adhesion properties with the metallic coating, and hence, no adhesive is necessarily required for the metallic coating. However, it is preferable to apply an adhesive before the metallic coating. The adhesive includes all conventional adhesives which are useful for adhering metals, for instance, polyurethane adhesives, epoxy resin adhesives, acrylic resin adhesives, urethane-acrylate resin adhesives, copolyester adhesives, polyester block copolymer adhesives, or the like. Among them, polyurethane adhesives, urethane-acrylate resin adhesives and copolyester adhesives are particularly preferred.

The polyurethane adhesive comprises a polyurethane which is a reaction product of a polyisocyanate compound and a polyol compound. Epoxy resin adhesive comprises a compound containing two or more epoxy groups (mainly polyglycidyl compound) and a curing agent such as a phenol compound, an amino compound, a melamine compound or an isocyanate compound. Acrylic resin adhesive comprises a copolymer of a (meth)acrylic derivative having a reactive functional group, a (meth)acrylic acid ester and styrene, and optionally a curing agent such as an amino compound, an epoxy compound, a dibasic acid, or an acid anhydride. The (meth)acrylic acid derivative having a reactive functional group includes acrylic acid, methacrylic acid or its derivative which contains a reactive group such as carboxyl, hydroxy, amino, methylol, or epoxy group. Urethane-acrylate resin adhesive comprises a modified blend of a (meth)acrylic resin and a polyurethane resin, or a (meth)acrylic acid derivative having a urethane bond in the molecule. Copolyester adhesive comprises a linear copolyester having a softening point of lower than 200° C. and consisting of a residue of a dibasic acid wherein at least 40% by mol is (i) terephthalic acid or (ii) a mixture of terephthalic acid and isophthalic acid and a residue of a glycol, and optionally a curing agent such as an isocyanate compound, a melamine compound, an epoxy compound or an acid anhydride.

The adhesive is preferably applied in a thickness of 5 to 50μ, more preferably 10 to 30μ, in dry state. The adhesive is applied to the molded product and dried, and thereafter, the metallic coating as mentioned hereinbefore is applied thereto.

The metallic coating layer is strongly adhered to the molded product and hence does not peel off or break when the product is bent. However, the metal-coated product may optionally be further coated with a top coat in order to improve the resistance against the peeling off and abrasion of the metallic coating layer as shown in FIG. 3. The top coating is performed by applying conventional coatings, such as copolyester coatings, acrylic resin coatings, urethane-acrylate resin coatings and polyester block copolymer coatings.

The copolyester coatings comprise a linear copolyester consisting of a residue of a dibasic acid wherein at least 40% by mol is (i) terephthalic acid or (ii) a mixture of terephthalic acid and isophthalic acid and a residue of a glycol, and optionally a curing agent such as an isocyanate compound, a melamine compound, an epoxy compound or an acid anhydride. Preferred linear copolyester consists of dibasic acid components consisting of terephthalic acid, isophthalic acid and an aliphatic dicarboxylic acid and glycol components consisting of ethylene glycol and neopentyl glycol. Acrylic resin coatings comprise a copolymer of mainly a (meth)acrylic acid derivative containing a reactive functional group, a (meth)acrylic acid ester and styrene, and optionally a curing agent such as an amino compound, an epoxy compound, a dibasic acid or an acid anhydride. The (meth)acrylic acid derivative having a reactive functional group includes acrylic acid, methacrylic acid or its derivative which contains a reactive group such as carboxyl, hydroxy, amino, methylol or epoxy group. Urethane-acrylate resin coatings comprise a modified blend of a (meth)acrylic resin and a polyurethane resin, or a (meth)acrylic acid derivative having a urethane bond in the molecule.

The top coating is preferably applied in a thickness of 5 to 50μ, more preferably 10 to 30μ.

The metal-coated product obtained above has excellent properties, such as suitable stiffness and elasticity and further excellent processability such as bending or folding. Moreover, the product can keep its beautiful appearance for a long period of time without peeling off of the metallic coating layer by deformation thereof and can be kept without rusting even if it is kept outdoors for a long period of time. For instance, when an emblem for automobile is prepared from the metal-coated product of the present invention, it can be bent with heating so as to fit it to the curve of the automobile because the plastic plate of the present invention is thermoplastic, and hence, the emblem can closely be fixed to the body of the automobile. Moreover, because of the appropriate stiffness, the metallic coating layer of the emblem does not peel off or break by bending or elongation of the emblem. Besides, because of the appropriate elasticity, when the emblem is fixed to the body of the automobile with a screw or the like, it can be fixed in a manner of snap-in fitting even if the screwed runner somewhat shifts, and further, the screw is tightened owing to the elasticity of the plastic and is prevented from falling off thereof. Even when the emblem is impacted by any accident, the impact is weakened owing to the elasticity of the plastic and is scarcely wholly destroyed. Besides, even if the emblem is partially dented or bent, the original shape is readily recovered without breaking or peeling off of the metallic coating. The emblem can keep its beautiful appearence for long period of time without rusting or deterioration.

When the metal-coated plastic product of the present invention is used as various thumb nuts, knobs, lugs, handles, or the like, particularly thumb nuts for electrical products or parts of automobile, they can be fixed only by press fitting without using screw which is essential in the conventional metallic thumb nuts, because the plastic has appropriate spring action and hence it is fixed well.

The present invention is illustrated by the following Examples but is not limited thereto.

EXAMPLE 1

The following polyester block copolymer and acrylic monomer/butadiene/styrene copolymer were used.

(1) Polyester block copolymer elastomer:

A block copolymer obtained by copolymerizing dimethyl terephthalate (1,300 parts by weight), 1,4-butanediol (1,100 parts by weight) and poly(tetramethylene oxide) glycol (molecular weight: about 1,000, 1050 parts by weight), which has a melting point of crystal: 205° C., and a reduced specific viscosity ($\eta$sp/c): 2.00 in a mixed solvent of phenol/tetrachloroethane (6/4 by volume) and in a concentration of the polymer of 0.2 g/100 cc at 30° C.

(2) Acrylic monomer/butadiene/styrene copolymer:

(a) Methyl methacrylate/butadiene/styrene copolymer resin (Kureha BTA, a tradename of Kureha Kagaku K.K.) (hereinafter, referred to as "MBS" resin)

(b) Acrylonitrile/butadiene/styrene copolymer resin (Kralastic MV, a tradename of Sumitomo Naugatuck Co., Ltd.) (hereinafter, referred to as "ABS" resin)

Polyester block copolymer (1) (70 parts by weight) and MBS resin (2a) (30 parts by weight) were pelletized at a temperature of the resins of 220° C. by using a single screw extruder. The pelletized resins were formed into a sheet having a thickness of 2 mm (Sheet A) by extruding at a temperature of the resins of 210° C. with a T-die extruder.

In the same manner as described above, a sheet having a thickness of 2 mm (Sheet B) was prepared from a mixture of polyester block copolymer (1) (70 parts by weight) and ABS resin (2b) (30 parts by weight).

In comparison purpose, a sheet of the polyester block copolymer (1) alone (thickness: 2 mm, Sheet C) and a sheet of MBS resin (2a) alone (thickness: 2 mm, Sheet D) were prepared likewise.

One surface of each Sheets A, B, C and D was coated with an acrylate adhesive (Avdel Bond F, a tradename of Avdel Co.). After the adhesive was dried, chromium was applied thereto by vacuum metallizing in a thickness of 0.3$\mu$ and thereon a top coating was applied by using a urethane-acrylate adhesive.

The thus prepared metal-coated products were subjected to the following tests.

Flexal test: The sheet (size: 10 cm × 5 cm) was bent at an angle of 90°, and the surface thereof was observed. As a result, in case of Sheets A and B, no break or peeling off of the metallic coating layer was observed, but in case of Sheet C, peeling off of the metallic coating layer was observed. Besides, Sheet D had inferior heat resistance and hence the molded product significantly deformed during the vacuum metallizing.

Scratch test: In accordance with the provision of JIS D 0202, the products were notched with a knife in both directions of length and width in an interval of 2 mm so as to make 100 squares (10×10) and thereon a cellophane pressure-sensitive adhesive tape was completely adhered and immediately the cellophane tape was peeled off at an angle of 90°, and then the remaining squares were counted. When the remaining squares are more, the adhesion is excellent. As a result, Sheets A and B showed excellent adhesion (100/100, and 100/100, respectively), but Sheet C was peeled off (0/100).

EXAMPLE 2

The following polyester block copolymer and acrylic monomer/butadiene/styrene copolymer were used.

(3) Polyester block copolymer elastomer:

A block copolymer obtained by copolymerizing dimethyl terephthalate (3,200 parts by weight), 1,4-butanediol (2,500 parts by weight) and poly(tetramethylene oxide) glycol (molecular weight: about 1,000, 1050 parts by weight), which has a melting point of crystal: 215° C., and a reduced specific viscosity ($\eta$sp/c): 1.50.

(4) Acrylic monomer/butadiene/styrene copolymer:

A graft copolymer consisting of 23% by weight of methyl methacrylate, 57% by weight of butadiene and 20% by weight of styrene.

A mixture of polyester block copolymer (3) (60 parts by weight) and acrylic monomer/butadiene/styrene copolymer (4) (40 parts by weight) was pelletized at a temperature of resins of 230° C. by using a twin screw extruder. The pelletized resins were formed into a sheet having a thickness of 2 mm (Sheet E) by extruding at a temperature of resins of 230° C. with a T-die extruder.

For comparison purpose, a sheet of the polyester block copolymer (3) alone (Sheet F) was prepared in the same manner as described above.

One surface of the Sheets E and F was coated with chromium by vacuum metallizing in a thickness of 0.2$\mu$ and thereon a top coating was applied in a thickness of 30$\mu$.

The top coating was performed by using a copolyester coating comprising 100 parts by weight of a copolyester consisting of a mixture of terephthalic acid/isophthalic acid/azelaic acid (30/28/42 by mol) (as the dibasic acid component) and a mixture of ethylene glycol/neopentyl glycol (55/45 by mol) (as the glycol component) which was dissolved in methyl ethyl ketone and 20 parts by weight of a curing agent (Collonate L, a tradename of an isocyanate curing agent made by Nippon Polyurethane Co.).

The metal-coated products were tested in the same as described in Example 1. The products having no top coating were also tested likewise. The results are shown in Table 1.

TABLE 1

| Top coating | Sheet E | | Sheet F | |
|---|---|---|---|---|
| | + | − | + | − |
| Flexal test | Excellent | Excellent | Peeling off of metallic coating | Break and peeling off of metallic coating |
| Scratch test | 80/100 | 70/100 | 10/100 | 0/100 |

As is clear from the above test results, the Sheet E obtained from the mixture of polyester block copolymer and methyl methacrylate/butadiene/styrene copolymer showed good properties, but the sheet F obtained from polyester block copolymer alone showed an inferior adhesion.

EXAMPLE 3

The polyester block copolymer (3) and methyl methacrylate/butadiene/styrene copolymer (4) as used in Example 2 were mixed in the ratio of 80/20, 45/55, 30/70 and 15/85 (reference example) by weight, and the mixtures were pelletized at a temperature of resins of 230° C. with a twin screw extruder. The pelletized mixtures were formed into a sheet having a thickness of 2 mm (Sheets G, H, I and J) at a temperature of resins of 240° C. with an injection molding machine.

These sheets G, H, I and J were applied with polyurethane adhesive (Chemlok 7000 and Chemlok 7203, tradenames of curing agents of Hughson Chemicals) in a thickness of 20μ. After drying, chromium was applied thereto by vacuum metallizing in a thickness of 0.05μ, and thereon a top coating was applied with an acrylic resin coating (Versilok 505, a tradename of Hughson Chemicals) in a thickness of 30μ.

The physical properties of these products were tested, and further, they were also subjected to the flexal test and scratch test likewise. The results are shown in Table 2.

TABLE 2

|  | Sheet G | Sheet H | Sheet I*[1] | Sheet J*[2] |
|---|---|---|---|---|
| Tensile strength (kg/cm²) | 300 | 240 | 170 | 100 |
| Elongation (%) | 350 | 350 | 100 | 50 |
| Vicat softening point (°C.) | 185 | 165 | 145 | 110 |
| Flexal test | Excellent | Excellent | Excellent | Brittle plastic base, break of metallic coating |
| Scratch test | 100/100 | 100/100 | 100/100 | 100/100 |

[Remarks]:
*[1] The product was slightly deformed during the vacuum metallizing.
*[2] The product was significantly deformed during the vacuum metallizing.

As is clear from the above test results, in case of Sheets G and H, they had excellent strength and excellent adhesion with the metallic coating layer. In case of Sheet I, it was slightly deformed during the vacuum metallizing, but other properties were all excellent. The Sheet J had inferior stiffness and hence was significantly deformed during the vacuum metallizing.

EXAMPLE 4

The following polymers were used.

(5) Acrylic monomer/butadiene/styrene copolymer:
A graft copolymer comprising 37% by weight of ethylhexyl acrylate, 21% by weight of butadiene, 26% by weight of methyl methacrylate, and 16% by weight of styrene.

(6) Butadiene/styrene copolymer (reference):
A block copolymer comprising 80% by weight of butadiene and 20% by weight of styrene.

(7) Polymethyl methacrylate (reference)

The polyester block copolymer (3) as used in Example 2 (80% by weight) were blended well with the polymer (5), (6) or (7) (each 20% by weight), and the mixture was formed into a sheet (Sheet K, L and M) in the same manner as described in Example 2. To the Sheets K, L and M was applied a urethane-acrylate resin adhesive (Reclac No. 110, a tradename of Fujikura Kasei Co.) in a thickness of 15μ. After drying, chromium was applied thereto in a thickness of 0.2μ by sputtering. The thus obtained metal-coated products were subjected to flexal test and scratch test in the same manner as described in Example 1. The results are shown in Table 3.

TABLE 3

|  | Sheet K | Sheet L | Sheet M |
|---|---|---|---|
| Flexal test | Excellent | Peeling off of metallic coating | Peeling off of metallic coating |
| Scratch test | 100/100 | 0/100 | 0/100 |

What is claimed is:

1. A metal-coated plastic product, which comprises a molded product of a mixture of:
   (a) 95 to 20% by weight of a polyester block copolymer consisting essentially of polyester segments having a high melting point, a component of which can singly form a high polymer having a melting point of 150° C. or higher, and polymer segments having a low melting point and a molecular weight of 400 to 6,000, selected from the group consisting of a polyalkylene ether glycol, a mixture of polyalkylene ether glycols and a copolyether glycol, a component of which has a melting or softening point of 80° C. or lower; and
   (b) 5 to 80% by weight of a copolymer comprising 10 to 80% by weight of an acrylic monomer selected from the group consisting of an alkyl ester of acrylic acid having 1 to 10 carbon atoms in the alkyl moiety, an alkyl ester of methacrylic acid having 1 to 10 carbon atoms in the alkyl moiety, acrylonitrile and metacrylonitrile, 10 to 70% by weight of butadiene and 10 to 60% by weight of styrene; and a layer of a metallic coating thereon.

2. A metal-coated plastic product according to claim 1, wherein the polyester block copolymer and the copolymer comprising an acrylic monomer, butadiene and styrene are contained in the mixture in the ratio of 95 to 40% by weight and 5 to 60% by weight, respectively.

3. A metal-coated plastic product according to claim 1, wherein the layer of a metallic coating has a thickness of 0.01 to 5μ.

4. A metal-coated plastic product according to claim 3, wherein the thickness of the metallic coating layer is in the range of 0.01 to 2μ.

5. A metal-coated plastic product according to claim 1, wherein the polyester block copolymer consisting essentially of 95 to 20% by weight of the polyester segments having a high melting point and 5 to 80% by weight of the polymer segments having a low melting point.

6. A metal-coated plastic product according to claim 1, wherein the polyester block copolymer is a polyester produced from a dicarboxylic acid containing 70% by mol or more of terephthalic acid or its ester-forming derivative and an aliphatic, aromatic or alicyclic diol having 2 to 10 carbon atoms and a polyalkylene ether glycol.

7. A metal-coated plastic product according to claim 1, wherein the polyester block copolymer is a member selected from the group consisting of polytetramethylene terephthalate/polytetramethylene oxide block copolymer, polytetramethylene terephthalate isophthalate/polytetramethylene oxide block copolymer and polytetramethylene terephthalate/poly-ε-caprolactone block copolymer.

8. A metal-coated plastic product according to claim 1, wherein the copolymer is a graft copolymer consisting of polybutadiene or a butadiene copolymer containing 95% by weight or less of an acrylic acid ester as the backbone and an acrylic monomer and/or styrene as the branch.

9. A metal-coated plastic product according to claim 1, wherein the layer of a metallic coating is provided via a layer of an adhesive.

10. A metal-coated plastic product according to claim 9, wherein the layer of an adhesive has a thickness of 5 to 50μ.

11. A metal-coated plastic product according to claim 9, wherein the adhesive is a member selected from the group consisting of polyurethane adhesives, urethane-acrylate resin adhesives and copolyester adhesives.

12. A metal-coated plastic product according to claim 2, wherein a layer of a top coating, selected from the group consisting of a copolyester coating, an acrylic resin coating, an urethane-acrylate resin coating and a polyester block copolymer coating, is provided on the layer of a metallic coating.

13. A metal-coated plastic product according to claim 12, wherein the layer of a top coating has a thickness of 5 to 50μ.

* * * * *